(12) United States Patent
Petrovic et al.

(10) Patent No.: US 8,655,934 B2
(45) Date of Patent: *Feb. 18, 2014

(54) BROADBAND LOW NOISE COMPLEX REGENERATIVE FREQUENCY DIVIDERS

(75) Inventors: Branislav Petrovic, La Jolla, CA (US);
Maxim Ashkenasi, La Jolla, CA (US);
Andre Basovich, San Diego, CA (US)

(73) Assignee: General Instrument Corporation, Horsham, PA (US)

( * ) Notice: Subject to any disclaimer, the term of this patent is extended or adjusted under 35 U.S.C. 154(b) by 1342 days.

This patent is subject to a terminal disclaimer.

(21) Appl. No.: 11/621,357

(22) Filed: Jan. 9, 2007

(65) Prior Publication Data

US 2008/0164916 A1    Jul. 10, 2008

(51) Int. Cl.
*G06F 1/02*    (2006.01)

(52) U.S. Cl.
USPC .......................................... 708/270; 327/117

(58) Field of Classification Search
USPC ................................................. 708/270–277
See application file for complete search history.

(56) References Cited

U.S. PATENT DOCUMENTS

| | | | | |
|---|---|---|---|---|
| 4,285,044 A * | 8/1981 | Thomas et al. | ............... | 708/276 |
| 4,577,287 A * | 3/1986 | Chrin | ............... | 708/276 |
| 4,888,719 A * | 12/1989 | Yassa | ............... | 708/276 |
| 5,280,539 A * | 1/1994 | Yeom et al. | ............... | 375/354 |
| 6,574,462 B1 | 6/2003 | Strange | | |
| 6,892,213 B2 * | 5/2005 | Huang et al. | ............... | 708/276 |
| 7,180,384 B2 * | 2/2007 | Efstathiou et al. | ............... | 332/106 |
| 7,348,818 B2 * | 3/2008 | Hulfachor et al. | ............... | 327/156 |
| 2006/0246861 A1 | 11/2006 | Dosanjh et al. | | |
| 2007/0071115 A1 * | 3/2007 | Suzuki et al. | ............... | 375/260 |
| 2009/0061810 A1 * | 3/2009 | Petrovic et al. | ............... | 455/323 |

OTHER PUBLICATIONS

A.A. Ciubotaru: "Technique for achieving wideband ½ regenerative frequency division using LSB-SSB modulation", Electronics Letters, Mar. 16, 1995, vol. 31, No. 6, pp. 425-426.
K. Honjo et al.: "Novel Design Approach for X-band GaAs Monolithic Analog ¼ Frequency Divider"; IEEE Transactions, vol. MTT-34, No. 4, Apr. 1986, pp. 436-441.
Robert Przyslupski: "Regenerative Frequency Dividers—Tutorial Paper"; Apr. 9, 2001.
Office Action, Canadian App. No. 2,617,006, Jul. 20, 2010.
Office Action, Canadian App. No. 2,617,006, Oct. 23, 2009.

* cited by examiner

*Primary Examiner* — Michael D Yaary
(74) *Attorney, Agent, or Firm* — Lori Anne D. Swanson

(57) ABSTRACT

A regenerative frequency divider device including a plurality of multipliers, each of which has a first input port, a second input port and an output port; a first combiner coupled to the plurality of multipliers so as to receive an output signal from at least two of the multipliers; and a second combiner coupled to the plurality of multipliers so as to receive an output signal from at least two of multipliers. Further, a first output signal generated by the first combiner is coupled to the second input port of at least two of the multipliers; and a second output signal generated by the second combiner is coupled to the second input port of at least two of the multipliers such that a complex signal is fed back to the multipliers performing the down conversion process. The present invention divider CRD can achieve superior output noise floor of −180 dBc/Hz at multi-GHz frequencies.

12 Claims, 3 Drawing Sheets

BROADBAND LOW NOISE COMPLEX REGENERATIVE FREQUENCY DIVIDERS

BACKGROUND OF THE INVENTION

1. Field of the Invention

This invention relates to a method and apparatus for performing frequency division exhibiting extremely low phase noise and low broadband noise, which is based on a novel complex regenerative divider (CRD) method employing complex frequency shifters (CFS) realized by double-quadrature multipliers configured in a feedback regenerative configuration.

2. Background of the Related Art

Frequency dividers or prescalers are among the essential building blocks in frequency generation and synthesis and are extensively utilized in these and many other applications. Two types of dividers are predominantly in use—digital and analog. Digital type dividers fall into two groups—static dividers and dynamic dividers. The static dividers are based on flip-flops (primarily D-type latches, but other types as well). The dynamic dividers are based on the regenerative principle similar to the one used with analog regenerative dividers described later, but with less control over the design and with fewer choices. Compared with analog dividers, digital dividers have higher phase noise, higher broadband noise floor and higher power consumption, particularly as the division ratio and frequencies go higher. Static digital dividers cannot operate at the high frequencies at which the regenerative type dividers operate. Also, digital dividers generally have higher electromagnetic interference (EMI) emissions or ingress into nearby circuits due to sharper transition edges. In modern systems demanding ever better performance, analog dividers are becoming the preferred and often the only choice. However, analog dividers have their own deficiencies, some of which are discussed below.

Analog dividers can be either injection locked or regenerative type. Injection locked dividers utilize an oscillator that is super-harmonically locked to a signal, thus dividing the frequency of the signal by the harmonic number. Injection locking can be used not only for frequency division, but also for frequency multiplication by sub-harmonically locking the oscillator to a signal. While these dividers can have very low noise (particularly if based on LC oscillators, as opposed to digital ring oscillators), they are fairly narrow band and are not suitable for wide frequency range applications.

The other type of analog divider is the regenerative type. The regenerative concept was originally introduced by T. W. Horton in 1922. In the last several years the regenerative concept has been receiving renewed attention, primarily due to its superior noise performance. This type of divider operates on a feedback principle, where a closed loop positive feedback system oscillates synchronously with the applied signal. The system uses a frequency translation device, such as a mixer, inside the loop. Provided enough loop gain and a proper loop phase, the system oscillates at a frequency fractionally related to the input frequency.

A classic prior art regenerative divide-by-2 circuit is shown in a block diagram of FIG. 1. As shown, the device employs a mixer 10 and a filter 12 in the feedback loop. The output of the mixer has two equal spectral components—the upper sideband (USB) at the frequency $f_{in}+\frac{1}{2}f_{in}=3/2f_{in}$ and the lower sideband (LSB) at $f_{in}-\frac{1}{2}f_{in}=\frac{1}{2}f_{in}$. The purpose of filter 12 is to reject the upper sideband and pass only the lower sideband frequency output by the mixer 10. In the device of FIG. 1, filter 12 is a low pass filter. A band pass filter can also be used since the output frequencies falling in the lower ⅓ portion of the frequency band of the filter cannot be used as explained below. In either case, the upper cut-off frequency, $f_c$, of the filter 12 must be below the USB frequency in order to suppress it.

The circuit of FIG. 1 operates in the following manner. The USB is removed from the loop by filter 12 and the only signal surviving and circulating in the loop is the lower sideband LSB at half the input frequency ½ $f_{in}$. If the phase shift around the loop at this frequency is 0° or 360° (or integer multiples of it) and the closed loop gain is unity, the circulation will be sustained and the loop will in effect oscillate and reach the equilibrium at half the input frequency, i.e. when $f_{out}=½ f_{in}$, effectively accomplishing the function of divide by 2. The earlier mentioned digital dynamic dividers work on this same principle, with the role of the filter 12 accomplished by the inherent roll-off frequency response of the active devices.

One significant limitation of the circuit of FIG. 1 as well as of most other prior art regenerative solutions is its limited instantaneous bandwidth or frequency range of operation. The BW is limited not only on the high frequency side as any other circuit, but this circuit is also limited on the low frequency side. The lower frequency limit occurs when the USB frequency at the output of the mixer falls within the pass band of the filter 12 and is no longer being suppressed. This creates a DSB condition of two equal level sidebands and ambiguity in the loop acquisition and capturing process, thereby preventing the loop to lock reliably or even at all to any of the two sidebands. This occurs for the output frequencies below one third of the filter cut-off, i.e. for $f_{out} \le \frac{1}{3} f_c$. The operation of the prior art circuit of FIG. 1 is thus limited to relatively narrow frequency range of less than 3 to 1, or practically not more than one octave. Another limitation of this circuit is the reduced signal to noise ratio (SNR) of the output divided frequency due to a double sideband conversion (DSB) used in the mixer 10. When compared with a single sideband conversion (SSB), the DSB conversion will exhibit a 3 dB lower SNR. That happens because only one of the two converted sidebands is used while the other one is wasted, i.e. half of the converted power is lost resulting in a 3 dB SNR reduction. This SNR loss adds to other circuit implementation losses and of course can not be recovered by any amount of post-mixer gain.

If instead of the LSB, the USB was selected or allowed to run in the loop (e.g., by a high pass filter at 12), the circuit would accomplish a fractional division by ⅔ or multiplication by 1.5.

Another prior art device is shown in the block diagram of FIG. 2. This device does not suffer the reduced SNR associated with the device of FIG. 1 due to the use of a well known SSB conversion realized by two mixers, 40 and 42, driven in quadrature in both the input port and the output return port. The outputs of the two mixers are summed in the combiner circuit 44 where the unwanted USB is canceled. The generation of quadrature signals is accomplished by the all-pass filters $H3(s)$ 50 and $H4(s)$ 52 employed in the feedback path coming from the output 46, and by the all-pass filters $H1(s)$ 54 and $H2(s)$ 56 located at the input path 14. The SSB conversion in this circuit suppresses the unwanted upper sideband and passes only the lower, desired sideband. The lower frequency is not limited by the USB rejection considerations, but rather by the available BW of the quadrature generation circuitry 50 through 56. The filter 18 is not necessary, but may improve the USB rejection at higher frequencies if needed. One downside of the circuit of FIG. 2 is associated with cascading the multiple dividers for the purposes of having higher division ratios, because the quadrature signals do not propagate through the system and cannot be reused (i.e., the signals are lost in this scheme). Therefore, a repeat of all four quadrature generation circuits 50 through 56 is necessary for every additional stage in the cascade, making the cascading and the often required higher division ratios impractical, large and not very cost effective.

Thus, there remains a need for regenerative frequency divider, which exhibit low phase noise and low broadband noise, and which solves the problems of the prior art regenerative frequency dividers noted above.

SUMMARY OF THE INVENTION

It is one objective of the method and apparatus of the present invention to provide frequency dividers having very low phase noise and very low broadband noise, which are suitable for use as a reference signal in frequency synthesizer applications or as a stand-alone signal source.

It is another objective of the present invention to provide a device having a very wide frequency range of operation with no inherent limitations, e.g., from low frequencies near DC to very high frequencies close to the transition frequency $f_t$ of the active devices used.

It is yet another objective of the present invention to allow for cascading of multiple stages of the present invention by directly interconnecting the cascaded stages without the need for additional circuitry to achieve higher division ratios.

Another objective of the present invention is provide a device which provides the output quadrature components I and Q of the divided signal for use as a source for other signal processing needs.

Yet another objective of the present invention is to provide a device which allows for fast acquisition of an input division signal and provides, at the output of the device, the divided signal's in-phase and quadrature components with minimal delay.

It is further objective of the present invention to provide a device which achieves low radiated and conducted EMI emissions and ingress, in order to reduce unwanted signal coupling or ingress into other circuits in densely populated designs, such as in monolithic ICs.

It is yet another objective of the present invention to achieve the above goals in a simple, cost effective design so to allow for implementation of the design in integrated circuits (ICs) without using external components such as bulky coils and capacitors and without a need for any adjustments, tweaking or calibration in production.

Accordingly, the present invention relates to a regenerative frequency divider device including a plurality of multipliers, each of which has a first input port, a second input port and an output port; a first combiner coupled to the plurality of multipliers so as to receive an output signal from at least two of the multipliers; and a second combiner coupled to the plurality of multipliers so as to receive an output signal from at least two of multipliers. Further, a first output signal generated by the first combiner is coupled to the second input port of at least two of the multipliers; and a second output signal generated by the second combiner is coupled to the second input port of at least two of the multipliers such that a complex signal is fed back to the multipliers performing the down conversion process.

The present invention also relates to a method of performing regenerative frequency division. The method includes the steps of receiving a complex input signal; generating a complex down-converted signal by complex mixing the complex input signal with the complex down-converted signal, by feeding-back the complex down-converted signal to a plurality of multipliers performing a down-conversion process; and outputting said complex down-converted signal as an output signal.

As detailed herein, the method and apparatus of the present invention provides numerous advantages over the prior art devices. For example, the circuit of the present invention is suitable for IC integration and capable of covering extremely wide frequency range from near DC to near maximum frequency of operation of active devices (e.g. close to a transition frequency $f_T$ of IC processes) in the multi-GHz range, thus offering significant performance advantages in frequency synthesis as a reference signal or as a stand-alone signal source such as a low jitter clock for ADCs or DACs and in many applications ranging from high speed digital communications in CATV to wireless communications and other modern consumer and commercial electronics devices.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

BRIEF DESCRIPTION OF THE DRAWINGS

The following drawings serve to illustrate the principles of the invention.

FIG. 3b is a simplified representation of the CRD divider circuit illustrated in FIG. 3a.

DETAILED DESCRIPTION OF THE INVENTION

Figure 1:
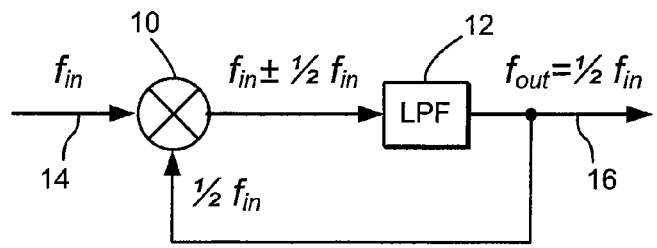
FIG. 1 illustrates a first prior art regenerative frequency divider circuit.
Figure 2:
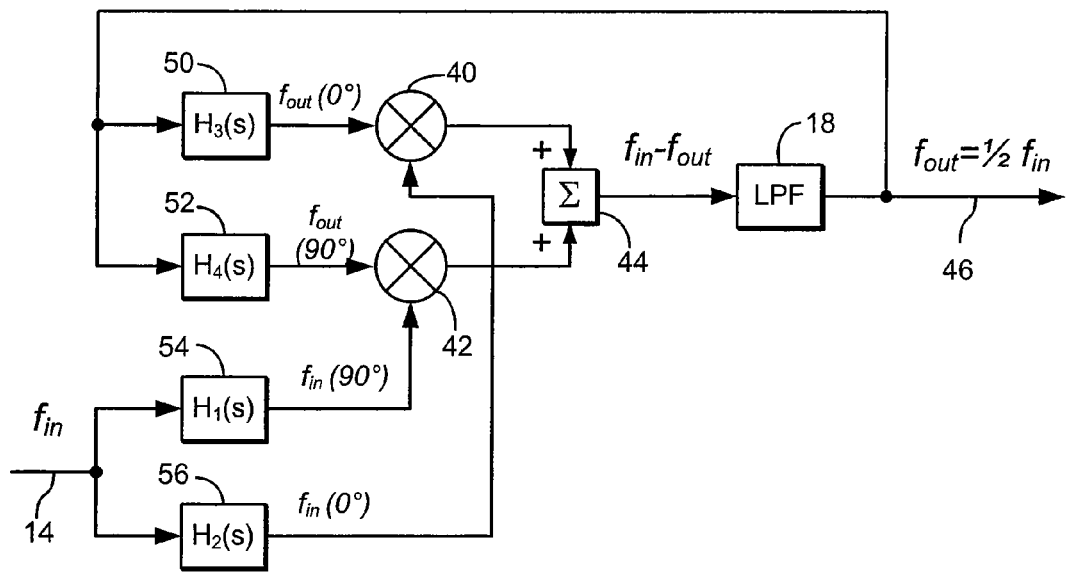
FIG. 2 illustrates a second prior art regenerative frequency divider circuit.
Figure 3A:
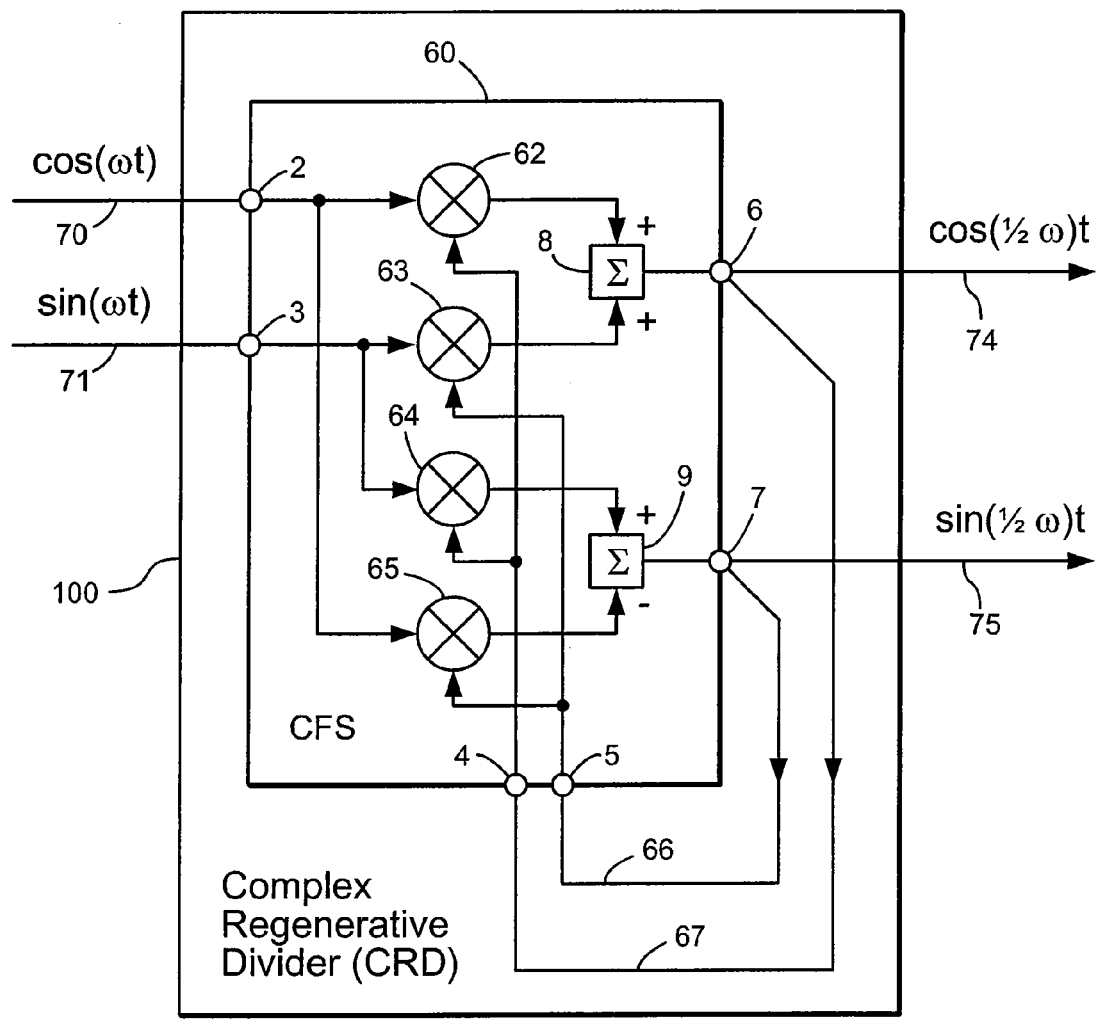
FIG. 3a illustrates an exemplary embodiment of the regenerative frequency divider circuit of the present invention.

FIG. 3a is an exemplary block diagram of the complex regenerative divider (CRD) circuit of the present invention. The CRD circuit 100 provides a divide-by-2 function, which is achieved by connecting a complex frequency shifter (CFS) 60 in a feedback configuration as shown in FIG. 3a. Referring to FIG. 3a, the circuit comprises four individual multipliers 62, 63, 64 and 65, a first combiner 8, and a second combiner 9 coupled in the manner illustrated in FIG. 3a. The CRD circuit receives two complex input signals, the first of which is received at inputs 2 and 3, and the second of which is received at inputs 4 and 5, and outputs one complex signal at outputs 6 and 7.

The complex frequency shifter 60 operates as a frequency divider due to the closed loop positive feedback created by connecting the output signal back to the input, forcing the circuit to oscillate at the frequency equal to the half of the input frequency, which is the equilibrium state. More specifically, when a complex signal having the in-phase component cos ωt and the quadrature component sin ωt is applied to the input ports 2 and 3, respectively, the CRD circuit of FIG. 3a performs frequency division by 2 and provides at the output ports the divided signal at half the input frequency. The divided output signal is also complex, having two divided frequency components in quadrature: the in-phase divided signal cos ½ωt at port 6 and the quadrature-phase divided signal sin ½ωt at port 7.

The CFS 60 is based on a double-quadrature multiplier scheme using four individual multipliers 62-65. The CFS 60 is configured for the complex down-conversion to the lower sideband LSB, i.e. producing the difference of the two input frequencies, determined by the polarity of the first and second combiners (i.e., summing/subtracting circuits) 8 and 9. In the given embodiment, for the desired down-conversion, the first combiner 8, which receives the outputs of multipliers 62 and 63 as input signals, is configured to generate a sum signal representing the sum of the outputs of multipliers 62 and 63, while the second combiner 9, which receives the outputs of multipliers 64 and 65 as input signals, is configured to generate a difference signal representing the difference of the outputs of the multipliers 64 and 65. As noted above, the output of the first combiner 8 is fed back to the inputs of multipliers 62 and 64, and the output of the second combiner 9 is fed back to the inputs of multipliers 63 and 65.

Figure 3B:
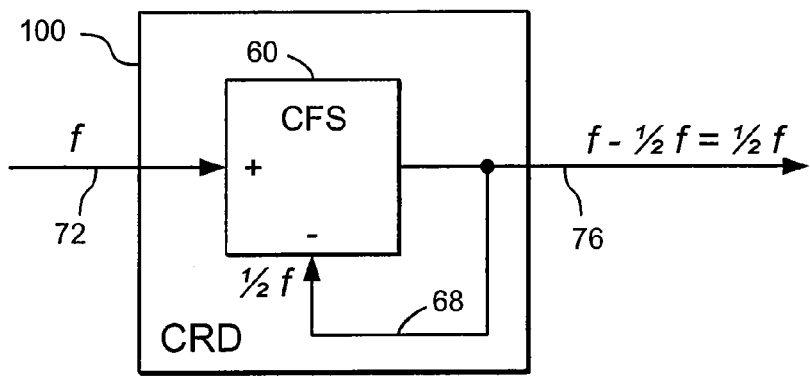

FIG. 3b is a simplified representation of the CRD divider circuit shown in FIG. 3a. FIG. 3b depicts the basic division property of the CRD circuit. The complex input and output ports of the CRD consisting of two ports each are represented in the diagram in FIG. 3b with a single line. The plus and minus signs inside the box 60 indicate whether the frequency at the corresponding port is added or subtracted at the output. The plus sign at the input complex line 72 signifies a positive addition of the frequency f at this port at the output, while the minus sign at the other input complex port 68 indicates that the frequency of that port (frequency ½ f) is subtracted at the output 76.

Figure 4:
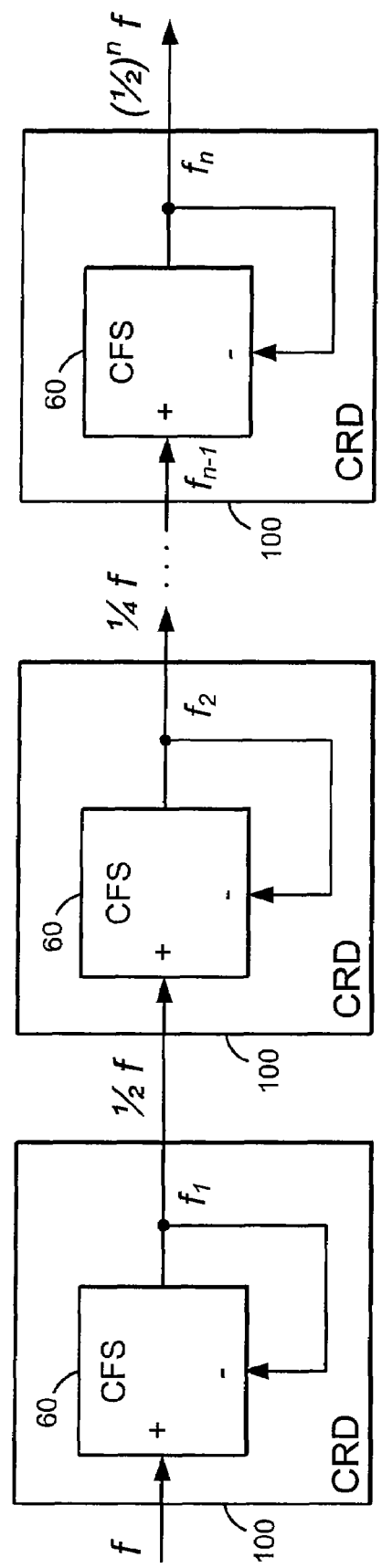
FIG. 4 illustrates a second exemplary embodiment in which a plurality of CRD's are coupled together in a cascading manner.

FIG. 4 shows a diagram of the present invention dividers connected in a cascade when higher division ratio is desired. The diagram shows a chain of n divider circuits of FIG. 3b, the output of one driving the input of the next, achieving a total division ratio of $(½)^n$. In-between stages all binary divisions are also available to tap, starting from ½ at the output of the first stage through to $(½)^n$ at the output of the last stage. All interconnect lines in FIG. 4 carry complex signals, i.e. each line carries two signals, I and Q.

As noted above, the frequency range limitation of the prior art circuits, and the difficulties associated with the cascading of multiple dividers to attain higher division ratios are resolved by the embodiment of the present invention shown in FIG. 3a. One important aspect of the circuit is connecting the complex frequency shifter 60 in a closed loop feedback configuration. In operation, the input frequency signal is applied to one input (2, 3) of the CFS 60 and with the output (6, 7) connected back to the other input (4, 5), and provided that there is a closed loop gain of unity and the phase of 0° or 360° (or integer multiples of 360°), the system is caused to oscillate at the frequency equal to half of the input frequency, which represents the equilibrium state of the CRD 60.

It is noted that while the embodiment of the CFS 60 shown in FIG. 3a is based on a double-quadrature multiplier scheme using four individual multipliers 62-65, other schemes providing complex frequency shifting functions can also be utilized to accomplish frequency division if configured in accordance foregoing embodiment of the present invention. The CFS 60 is configured to perform the complex down-conversion to the lower sideband LSB, i.e. to produce the difference of the two input frequencies, which is determined by the polarity choice of the signal combiners 8 and 9. As noted, the CFS 60 has two complex inputs (2, 3) and (4, 5) and one complex output (6, 7). Each complex input consists of a pair of ports: the in-phase I port 2 and the quadrature Q port 3. The complex output port (6, 7) also consists of an I port 6 and a Q port 7. The first complex input is at ports 2 and 3, where port 2 is the I or cosine input port and port 3 is Q or sine input port. The second complex input is at ports 4 and 5, port 4 being the I or cosine and port 5 the Q or sine input port. The complex output consists of port 6, the I or cosine output and of port 7, the Q or sine output. The feedback loop in the present invention CRD is established by connecting the output ports 6 and 7 of the CFS 60 back to its input ports 4 and 5 via the connections 66 and 67, respectively, as shown in FIG. 3a. While shown here as direct interconnects, the feedback connections 66 and 67 may also be formed utilizing a network or a circuit, and/or even active amplifiers to facilitate desired aspects of the feedback and optimize the overall circuit operation.

When a complex signal having the in-phase component cos ωt and the quadrature component sin ωt is applied to the input ports 2 and 3, respectively, the CRD circuit of FIG. 3a performs frequency division by 2, and at the output ports provides the divided signal at half the input frequency. The divided output signal is also complex and has two divided frequency components: the in-phase divided signal cos ½ωt at port 6 and the quadrature divided signal sin ½ωt at port 7. With the input signal expressed in the phasor form using Euler's formula:

$$e^{j\omega t}=\cos \omega t+j \sin \omega t \text{ at complex port (2,3)}, \quad (1)$$

the divided-by-2 signal at the output of the CRD 100 can also be expressed in a complex form:

$$e^{j\omega t}=\cos(\omega t/2)+j \sin(\omega t/2) \text{ at complex port (6,7)}, \quad (2)$$

Equations (1) and (2) express the canonical operation of the CRD circuit. Specifically, the CRD circuit takes the input complex signal $e^{j\omega t}$, operates on its argument and delivers the divide-by-2 complex signal $e^{j\omega t/2}$ at the output. The real and imaginary components of the output complex signal in Eq. (2), representing the in-phase and the quadrature components of the divided output are in quadrature. The phases of the output components in respect to each other and in respect to the input signal are well defined. Unlike with some quadrature generators based on the dividers of the prior art, with the present invention there is no ambiguity regarding which component leads the phase and which lags. That can be easily verified by examining the phase relationship of the components in Eq. (1) and (2): the output signal at port 6 providing the output's real component cos ½ωt is clearly in-phase (0°) in respect to the input in-phase component cos ωt; the signal at output port 7 sin ½ωt clearly lags behind the in-phase signal at port 6 making the signal at port 7 unambiguously a quadrature component lagging behind the in-phase signal by 90°. With complex signals a frequency sense can be defined based on the direction of rotation of the phasor representing the complex signal. By convention "positive" frequencies rotate counter-clockwise while the "negative" rotate clockwise. The two complex inputs of the CFS 60 are not interchangeable or commutable in the configuration of the present embodiment. However other phasing relationships at input ports 2 through 5 can result in successful division, as long as the sense of the feedback frequency matches that of the input. For instance, swapping ports 2 and 3 would work, producing a negative frequency at the output, i.e. the quadrature component leading the phase by 90°.

It is noted that providing the quadrature components at the output of CRD is an important aspect of the present invention. More specifically, the availability of the I and Q quadrature components of the divided signal may be useful as a quadrature source for other elements/components in the system. For instance, the quadrature signal output by the CRD divider can be used to drive an I, Q modulator stage in a transmitter application, or an I, Q demodulator in a receiver application as a quadrature local oscillator (LO), replacing, for example, poly-phase filters commonly used to derive quadrature components. Also, the quadrature components can be utilized for direct cascading of multiple CRD divider stages to obtain higher division ratios, for example, in a synthesizer application as an LO signal. Unlike the prior art, in the given embodiment, the quadrature phase relationship is preserved from stage to stage, i.e. the quadrature relationship "propagates" through the system and need not be recreated again anywhere in the chain. Hence, cascading can be easily accomplished by simply connecting the output ports of one stage to the corresponding input ports of the next stage, i.e. simply connecting the complex output port (6, 7) to the input complex port (2, 3) of the next stage and so on. As example of cascading CRD's is shown in FIG. 4 using the simplified block diagram of the present invention CRD depicted in FIG. 3b.

It is further noted that with a pure divided sinusoidal signal per Eq. (2) there would be no unwanted images or sidebands at the output and no filtering would be required, the principal advantage of the complex multiplication compared with a single-dimensional operation. Of course, a pure sine-wave per Eq. (2) implying a perfect linearity cannot be realized even with a perfect CFS—it can only be approached, because a small nonlinearity in the circuit is actually necessary to provide limiting of the output amplitude, which otherwise would grow without a bound. The CRD circuit as any other system with a closed loop positive feedback needs a nonlinear limiting or a signal compression mechanism to bound the growth of the oscillation amplitude. The nonlinearity can be located anywhere in the loop of the CRD circuit to provide the limiting, for instance, within the multipliers 62 through 65 or in the combiners 8 and 9. The nonlinearity in the loop implies presence of harmonic distortion in the output waveform.

Depending on the nonlinearity and the system gain, the harmonic distortion can be very small, but nonetheless finite. In a practical CFS due to circuit imperfections and imbalances of amplitude and phase in the I and Q arms, there will be other unwanted terms, such as images, input signal leakages, etc. at the output. In a typical IC circuit these terms will be in the order of 35 dBc to 40 dBc below the desired signal. These terms will not interfere with the basic operation of the CRD circuit as long as these terms are low enough, below the capture threshold of the CRD circuit.

However, the presence of the harmonic energy implies that the CRD circuit may have the ability to be sub-harmonically or super-harmonically lock to the input signal, provided the fundamental energy is removed by filtering and only harmonic energy is allowed to flow in the loop. This method can potentially enable a multiplication function or a non-integer, fractional division with the CRD circuit of the present invention.

Considering only the arguments of Eq. (3a) and replacing the angular frequencies ω with corresponding frequencies f, the relation between the input and the output frequencies of the CRD configuration of FIG. 3b can be expressed simply:

$$f_{out}=f-f_{out}=>2f_{out}=f=>f_{out}=\tfrac{1}{2}f \quad (3)$$

Eq. (3) reveals the powerful outcome of closing the loop around the CFS 60 in the CRD circuit of the present invention, namely, there is only one condition that satisfies equation (3) and that condition occurs when the output frequency equals half of the input frequency, i.e. when the circuit performs division by 2.

The operation of the frequency division of the CRD circuit of the present invention as shown in FIG. 3a can be confirmed analytically by solving a set of differential equations modeling the system. The equations can be established by examining the signal paths around the circuit loops leading to the following:

$$u(t)=\cos(\omega t)\cdot F[b\cdot u(t-\tau)]+\sin(\omega t)\cdot F[b\cdot w(t-\tau)] \quad (4)$$

$$u(t)=\sin(\omega t)\cdot F[b\cdot u(t-\tau)]-\cos(\omega t)\cdot F[b\cdot w(t-\tau)] \quad (5)$$

The terms of Eq. (4) and (5) are defined with reference to the CRD circuit of FIG. 3a:

$\cos(\omega t)$ and $\sin(\omega t)$ are the in-phase and the quadrature components of the input complex signal applied to the input ports 2 and 3, respectively; unity input amplitude is implied;

u and w are the in-phase and quadrature outputs at ports 6 and 7;

$\tau$ is the time delay from the input to the output of the circuit (this is an inherent propagation delay due to signal's physical path length and due to low-pass response of the devices and associated delay related to the maximum transition frequency $f_T$, i.e. $\tau$ is on the order of $1/f_T$; this delay is assumed much smaller than the period $T=2\pi/\omega$, or $\omega\tau\ll 1$, consistent with the input signal being well within the bandwidth of the system);

b is the coefficient representing the gain of each multiplier 62 through 65

F is a nonlinear function related to the transfer function of the multipliers, which for the analytical study of a case of small signals is modeled as a third order polynomial:

$$F(z)=z-\epsilon\cdot z^2 \quad (6)$$

Under the condition $\omega\cdot\tau\ll 1$ system of equations (4) and (5) can be replaced with approximate system of differential equations. With introduction of a new variable $$t'=t-\tau \quad (7)$$

and expansion of u(t'+τ) and w(t'+τ) into a series for small τ

$$u(t'+\tau)\approx u(t')+\tau\cdot\frac{du}{dt'}=u(t')+\tau\cdot\dot u(t'),$$

$$w(t'+\tau)\approx w(t')+\tau\cdot\frac{dw}{dt}=w(t')+\tau\cdot\dot w(t'),$$

and utilizing eq. (6) the equations (4) and (5) are rewritten as $$\tau\cdot\dot u+u=\cos[\omega\cdot(t'+\tau)]\cdot b\cdot(u-\epsilon\cdot b^2\cdot u^3)+ \sin[\omega(t'+\tau)]b\cdot(w-\epsilon\cdot b^2\cdot w^3) \quad (8)$$

$$\tau\cdot\dot w+w=\sin[\omega\cdot(t'+\tau)]\cdot b\cdot(u-\epsilon\cdot b^2\cdot u^3)- \cos[\omega(t'+\tau)]b\cdot(w-\epsilon\cdot b^2\cdot w^3) \quad (9)$$

An approximate solution of the system, Eq. 8, 9, for oscillations of small amplitude is found with the perturbation method in the following form:

$$u(t')=a(t')\cdot\cos\left[\frac{w}{2}\cdot t'+\beta(t')\right] \quad (10)$$

and $$w(t')=a(t')\cdot\sin\left[\frac{w}{2}\cdot t'+\beta(t')\right].$$

Here α(t') and β(t') are slowly varying amplitude and phase of the oscillations. Substitution of these expressions into the system, Eq. 8, 9, and averaging over the fast oscillations gives the following equations for the amplitude and phase $$\dot{\alpha} = \tau^{-1} \cdot \alpha [-1 + b \cdot (1 - 3\epsilon \cdot b^2 \cdot \alpha^2/4) \cdot \cos(2\beta - w \cdot \tau)], \quad (11)$$

$$\dot{\beta} = -\tau^{-1} \cdot [w \cdot \tau/2 + b \cdot (1 - 3\epsilon \cdot b^2 \cdot a^2/4) \cdot \sin(2\beta - w \cdot \tau)]. \quad (12)$$

Steady-state solution of this system corresponds to the condition $\dot{\alpha}=0$ and $\dot{\beta}=0$ and has the following values for amplitude and phase of the oscillation waveform $$\alpha = \frac{2}{b} \sqrt{\frac{b-1}{3\varepsilon \cdot b}} \quad (13)$$

and $$\beta = w \cdot \tau / 4,$$

where α is the steady-state oscillation amplitude of the signal at output ports 6 and 7. This solution is stable as can be shown from the analysis of the system of Eq. (11) and (12): any small perturbations of α(t') and β(t') from the steady-state values per. Eq. (13) will decrease or decay with time. Substitution of expressions (7) and (13) into (10) provides the final analytical solution for small amplitude oscillations in the CRD circuit of FIG. 3*a*:

$$u(t) = \frac{2}{b} \cdot \sqrt{\frac{b-1}{3\varepsilon \cdot b}} \cos\left[\frac{w}{2} \cdot \left(t - \frac{\tau}{2}\right)\right]. \quad (14)$$

and $$w(t) = \frac{2}{b} \cdot \sqrt{\frac{b-1}{3\varepsilon \cdot b}} \sin\left[\frac{w}{2} \cdot \left(-\frac{\tau}{2}\right)\right].$$

The analytical expression (14) of the oscillation waveform describes the divided output with two orthogonal sinusoidal waveforms, i.e. it shows that the output signals at ports 6 and 7 of the CRD circuit are two sine-waves with phase in quadrature. The argument of the square-root function must be positive, setting the condition for sustained oscillations: the gain coefficient b must be greater than 1, consistent with the general concept of necessary condition for oscillations. Expression (14) also reveals that the output waveform is nominally in phase with the input waveform except for the time delay τ/2 causing a phase shift or phase lag of ω·τ/4 of the divided output signal in respect to the input signal.

The following is an example of numerical values of parameters in eq. (14): for $\epsilon=\frac{1}{3}$ and with the magnitude of the gain b=1.1, the output amplitude of the output oscillations is α=0.55. The polynomial model of the function F per eq. (6) with $\epsilon=\frac{1}{3}$ matches the expansion of a nonlinear function F(z)=tan h(z) to within the third order term. With lower values of ε representing active devices more realistically and with higher values of the gain factor b, higher output oscillation amplitudes will be obtained. With $\epsilon=0.1$ and b=1.1, the output amplitude is computed at α=1.00 which represents a case of unity gain from input to output of the CRD circuit. The unity gain is important for the case of interconnecting multiple circuits, such as in the case of cascading of multiple CRD circuits in order to achieve higher division ratios. Unity gain will maintain uniform signal levels through out the cascade chain, eliminating a need for any amplification or attenuation thereof For example, the CRD circuit with the same parameters as above and an input signal of 0.6 V peak to peak (approx. 0 dBm) will produce a divided output signal of also 0 dBm, enabling an easy interface to the next stage of the same or similar kind.

The analytical solution per expression (14) of the model system of differential equations (8-9) describes stable oscillations in the CRD divider system driven by the input signal. However, as with any closed loop feedback system the stability of the system over the entire frequency range where the open loop gain is greater than one must be ensured. Due to the closed loop configuration, depending on the particular implementation of the CRD divider, the risk of potential spurious response unrelated to the input frequency may exist. This possibility should be analyzed and if needed addressed at the circuit level.

Numerical simulations of the behavior of the system of equations (4) and (5) at higher gain values performed with the Spice simulator show stable oscillations at half frequency of the input signal and presence of harmonics in the oscillations spectrum.

The acquisition of the input division signal and subsequent delivery of the divided signals at the output of both the in-phase and quadrature components is very fast, on the order of the delay time τ. With high frequency IC processes the time delay τ can be extremely small. For instance, with $f_T$ of 25 GHz, τ is in the order of 40 ps. The fast response of the CRD circuit is possible because there are no other delay mechanisms (such as filter delays or similar) besides the core delay τ to slow the signal down, as may be the case with some prior art solutions. Thus, the quadrature components I and Q of the divided signal with the present art method will be generated and provided at the output very fast, almost instantaneously, incurring only a minimum delay equal to the propagation delay τ upon application of the input signal. This is a valuable feature for applications requiring very fast frequency hopping, such as in spread-spectrum systems and other fast signal switching applications.

The CRD of the present invention utilizes two input signals in quadrature in order to operate. These signals need to be provided externally to the circuit. However, unlike in most complex signal applications where high precision of the source quadrature level and phase is required, with the CRD circuit this is not the case even for a very broad frequency range or bandwidth of operation. An exact quadrature level and phase match of the input signals is not required for operation of the CRD circuit. It was determined by Spice simulations that the CRD circuit tolerates well both a level mismatch and a phase error between the input quadrature signals. This property of the CRD circuit of the present invention enables the use of simple circuits of small size and low power for quadrature signals generation, such as the first order RC lead-lag circuit rather than much larger and power-hungry higher order poly-phase filters.

In fact, the CRD circuit is particularly tolerant of phase errors—not only that it tolerates, but the CRD circuit corrects the error and restores or regenerates the exact quadrature phase relationship at the output of the CRD circuit. Simulations show a robust operation of the CRD circuit even in the presence of a very large quadrature error in the input signal (close to 90°), i.e. only a few degrees from being in-phase instead of in quadrature. Under such skewed, nearly in-phase condition of the input I and Q signals, the CRD circuit still works reliably. Although under these extreme conditions the output waveform is distorted, nevertheless the I and Q spectral components of the divided output waveforms still maintain nearly perfect 90° quadrature relationship. This phenomenon suggests an underlying orthogonality between the I and Q spectral components of the divided signal in the CRD circuit and enables its use as a precision quadrature signals generator, valuable for many applications.

The waveform of the divided signal depends on the nonlinearity and the gain of the CRD circuit. The waveform shape can be controlled by choosing particular nonlinear characteristics and the gain of the system. Weak nonlinearities will produce sine-like waveforms, moderate nonlinearities triangular-like waveforms, while strong nonlinearities produce more square-like wave shapes. For example, controlling the gain, compression point and operating conditions of, for example, Gilbert-cell mixers commonly used in ICs, a triangular-like waveform can be obtained. The spectrum of a triangular waveform equals the spectrum squared of the rectangular pulses, i.e. it has the form of $(\sin x/x)^2$, where the higher frequency spectral components fall-off faster with the frequency increase than those of the square-waves (at the rate two times faster in dB). Lower energy of higher frequency components helps to minimize the unwanted signal coupling and EMI. It also reduces the power consumption associated with fast pulse transitions. With a different nonlinearity, such as a third order curvature per eq. (6), nearly a pure sine waveform can be obtained.

The low noise property of the CRD circuit stems from its principle of operation based on the multiplication process, which can be inherently very low noise process, and subsequent recycling of the multiplication product in the loop. The output noise resulting from this process is the function of the following factors: the noise figures of the input ports, the magnitude of the signal levels applied to these ports, the effects of the closing of the loop and the effects of the division. The input noise is reduced by the division operation but then it is recycled back to the input, resulting in somewhat higher closed loop noise compared with the open loop noise. Frequency division by 2 reduces the phase noise voltage by a factor of 2 (this is because halving of the frequency also halves the index of phase modulation which in this case is caused by noise, thus halving the noise voltage) which translates to ¼ or 6 dB of phase noise power reduction. The phase noise in general represents only half of the broadband noise power and the other half is the amplitude noise, which does not get reduced by division. This implies that the reduction of total noise power by frequency division is less than 6 dB and closer to 2 dB, because only ½ of the total power (the phase noise portion) is reduced by ¼ by frequency division while the other ½ of the power (the amplitude noise) remains unaffected: $10 \cdot \log[(½+(½)\cdot(¼)]=-2$ dB. However, due to the signal limiting occurring in the present invention frequency divider, some of the amplitude noise is converted to phase noise, making the phase noise dominant, thus greater improvement by division than per the above analysis. Hence, it is reasonable to conclude that frequency division by 2 results in ½ or 3 dB of total noise power reduction. Considering unity closed loop gain in the CRD circuit, it can be assumed in the first order approximation that about ½ of the input noise power, after being reduced by the division, returns back from the output to the input degrading the noise figure by about $10 \cdot \log(1+½)=2$ dB. Therefore, the estimated noise figure of the closed loop CRD circuit is about 2 dB higher than the noise figure of the CFS 60 device alone when used in an open loop configuration. The close-in phase noise is predominantly determined by the flicker-noise of the devices used.

Extremely low phase-noise and broadband noise (i.e. extremely high broadband SNR) are achievable with the CRD circuit of the present invention. This is possible because its noise is determined predominantly by the performance of the multiplying elements or mixers used in the circuit block CFS 60, the characteristics of which can be controlled and favorably affected to a large extent by design choices and implementation. The CRD circuit's close-in phase-noise is governed by the close-in flicker noise of the mixers, while the broadband noise of the CRD circuit is governed by the noise figure of the mixers (i.e., multipliers). Particularly suitable mixers providing low noise and high signal level capability for use in the present invention include, but are not limited to, analog or RF types such as single or double-balanced mixers with diodes or active-switches, and Gilbert-cell based mixers. It is well known in the art that very low noise figures and flicker noise levels are achievable with mixers, including the ones integrated in ICs implementation, with low noise figures resulting in noise floors not far from the thermal noise of −174 dBm/Hz and very low flicker noise corners below 1 kHz, providing extremely low close-in phase noise. Using mixers with higher compression points capable of handling yet higher signal levels and increasing the signal drive levels, it is possible with the CRD circuit to achieve a very high output SNR in excess of 180 dBc/Hz.

The following examples illustrate the outstanding broadband SNR performance achievable with the CRD circuit of the present invention using an IC implementation in the first example and the off-the-shelf mixers in the second.

Example 1 integrated IC solution at input frequency of 2 GHz the CRD circuit achieves 170 dBc/Hz SNR at the divided output, per the following scenario: signal level at input ports 2 and 3 each of 5 dBm; the output level at ports 6 and 7 each of 5 dBm; the feedback signals at input ports 4 and 5 are the same as the output level of 5 dBm; conversion gain from input to output of 0 dB (unity gain); noise figure referenced to each input port of 7 dB; thermal noise of −174 dBm/Hz. With these values the output SNR is calculated: SNR=5 dBm (input level)+174 dBm/Hz−7 dB (CFS noise figure)−2 dB (CRD degradation) =170 dBc/Hz. In comparison, the SNR performance of today's conventional digital divider ICs is not much better than 150 dBc/Hz at 2 GHz, highlighting the impressive 20 dB advantage of the CRD circuit of the present invention. The level of the presently achievable IC performance illustrated in this example by no means presents an upper limit. Even today (mid 2006) with some more advanced IC processes and more aggressive signal drives it may be possible to exceed the performance shown in this example, and certainly as the IC technology advances and the signal power compression point and noise figure performance of mixers and amplifiers improve, so can the CRD performance.

Example 2 with passive mixers at input frequency of 5 GHz the CRD circuit of FIG. 3a achieves 180 dBc/Hz SNR at divided output per the following scenario: signal level at input ports of 16 dBm; signal level at output ports of 6 dBm; total loss from input to output of 10 dB; thermal noise of −174 dBm/Hz. With these values, the output SNR calculates to: SNR=16 dBm (input level)+174 dBm/Hz−10 dB (in-out loss)=180 dBc/Hz. The noise figure of the passive mixers in this calculation was assumed close to conversion loss. It is possible by using mixers with yet higher LO and input signal levels to attain even more impressive CRD performance than in this example.

When multiple CRDs are connected in a cascade per FIG. 4 for higher division ratios, the noise is dominated by the last stage in the cascade. Assuming a 3 dB noise reduction of the incoming noise in each stage, the following expression estimates the noise figure of a chain of n stages of the present invention divider circuit CRD connected in cascade:

$$F_{tot}=2\cdot(1-½^n)\cdot F \leq 2\cdot F \Rightarrow NF_{tot} \leq NF+3 \text{ dB}, \quad (15)$$

where F is the noise factor and NF the noise figure in dB of each divider stage, and $F_{tot}$ and $NF_{tot}$ the noise factor and the noise figure in dB, respectively, of the entire cascade. Eq. (15) shows that the cascade of dividers will not degrade the noise figure or the output SNR by more than 3 dB above that due to a single stage.

The processes described in connection with FIGS. 3A, 3B and 4, may be implemented in hard wired devices, firmware or software running in a processor. For example, a DSP processor could be programmed to implement the embodiments of the present invention disclosed herein. Further, programs for running such a DSP may be contained on a computer readable medium which may be read by a DSP or computer. A computer readable medium may be any medium capable of carrying instructions to be performed by a microprocessor, including a CD disc, DVD disc, magnetic or optical disc, tape, silicon based removable or non-removable memory, packetized or non-packetized wireline or wireless transmission signals.

Although certain specific embodiments of the present invention have been disclosed, it is noted that the present invention may be embodied in other forms without departing from the spirit or essential characteristics thereof. Thus, the present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A regenerative frequency divider device performing frequency division by combining signals generated using an external complex input signal with components of the external complex input signal, the regenerative frequency divider device comprising:
    a plurality of multipliers, each of which has:
        a first input for receiving an external complex input signal having a first frequency, and
        a second input for receiving a signal generated using the external complex input signal,
    a first combiner coupled to a first multiplier of said plurality of multipliers for receiving an in-phase portion of the external complex input signal, the first combiner coupled to a second multiplier of said plurality of multipliers for receiving a quadrature portion of the external complex input signal, said first combiner outputting an in phase output signal having a frequency fractionally related to the first frequency;
    a second combiner coupled to a third multiplier of said plurality of multipliers for receiving an in-phase portion of the external complex input signal, the second combiner coupled to a fourth multiplier of said plurality of multipliers for receiving a quadrature portion of the external complex input signal, said second combiner outputting a quadrature output signal having a frequency fractionally related to the first frequency;
    wherein the in phase output signal from the first combiner is couplable to the second input port of at least two of said plurality of multipliers to create a positive closed loop feedback thereof and the quadrature output signal from the second combiner is couplable to the second input port of at least two of said plurality of multipliers to create a positive feedback thereof,
    wherein responsive to inputting the in phase and quadrature output signals to the second inputs of the plurality of multipliers, the regenerative frequency divider oscillates synchronously with the external, complex signal received at the first input at the frequency fractionally related to the first frequency.

2. The regenerative frequency divider device of claim 1, wherein:
    an output of the first multiplier is couplable to said first combiner, said first multiplier receiving the in phase portion of the external complex input signal at said first input port and receiving said in phase output signal at said second input;
    an output of the second multiplier is couplable to said first combiner, said second multiplier receiving the quadrature portion of the external complex input signal at said first input port and receiving said in phase output signal at said second input;
    an output of the third multiplier is couplable to said second combiner, said third multiplier receiving the in phase portion of the external complex input signal at said first input port and receiving said quadrature output signal at said second input; and
    an output of the fourth multiplier is couplable to said second combiner, said fourth multiplier receiving the quadrature portion of the external complex input signal at said first input port and receiving said quadrature output signal at said second input.

3. The regenerative frequency divider device of claim 2, wherein said first combiner operates to sum the output signal from said first multiplier and the output signal from said second multiplier.

4. The regenerative frequency divider device of claim 2, wherein said second combiner operates to generate a difference signal representing the difference between the output signal of said first multiplier and the output signal of said second multiplier.

5. The regenerative frequency divider device of claim 2, wherein said quadrature portion of the external complex signal corresponds to a sine portion, and said in phase portion of the external complex signal corresponds to a cosine portion.

6. The regenerative frequency divider device of claim 2, wherein the combination of outputs from said first and second combiners is a complex output signal having a cosine portion and a sine portion, said in phase output signal of said first combiner corresponding to the cosine portion of said complex output signal and said quadrature output signal of said second combiner corresponding to the sine portion of said complex output signal.

7. A method of performing regenerative frequency division comprising the steps of:
    receiving, at a combiner circuit, an external complex input signal, the external complex input signal being an analog signal having a first frequency and having an in-phase component and a quadrature component;
    generating, at the combiner circuit, a complex down-converted signal having a second frequency, the second frequency less than the first frequency, by complex mixing said external complex input signal with said complex down-converted signal by feeding-back said complex down-converted signal to a plurality of multipliers performing a down-conversion process,
    wherein the regenerative frequency divider, responsive to feeding-back in phase and quadrature components of said complex down-converted signal to the plurality of multipliers, oscillates synchronously with the external complex input signal at a second frequency fractionally related to the first frequency; and
    outputting, from the combiner circuit, said complex down-converted signal as an output signal.

8. The method of performing regenerative frequency division of claim 7, wherein:

an output of a first multiplier of the plurality of multipliers is couplable to a first combiner, said first multiplier receiving an in phase portion of the external complex input signal at said first input port and receiving an in phase output signal from output by the first combiner at said second input;

an output of a second multiplier of the plurality of multipliers is couplable to said first combiner, said second multiplier receiving a quadrature portion of the external complex input signal at said first input port and receiving an in phase output signal output by the first combiner at said second input;

an output of a third multiplier of the plurality of multipliers is couplable to said second combiner, said third multiplier receiving the in phase portion of the external complex input signal at said first input port and receiving said quadrature output signal output by said second combiner at said second input; and an output of a fourth multiplier of the plurality of multipliers is couplable to said second combiner, said fourth multiplier the quadrature portion of the external complex input signal at said first input port and receiving said quadrature output signal output by said second combiner at said second input.

9. The method of performing regenerative frequency division of claim 8, wherein said first combiner operates to sum the output signal from said first multiplier and the output signal from said second multiplier.

10. The method of performing regenerative frequency division of claim 8, wherein said second combiner operates to generate a difference signal representing the difference between the output signal of said first multiplier and the output signal of said second multiplier.

11. The method of performing regenerative frequency division of claim 8, wherein said quadrature portion of the external complex signal corresponds to a sine portion, and said in phase portion of the external complex signal corresponds to a cosine portion.

12. The method of performing regenerative frequency division of claim 8, wherein the combination of outputs from said first and second combiners is a complex output signal having a cosine portion and a sine portion, said in phase output signal of said first combiner corresponding to the cosine portion of said complex output signal and said quadrature output signal of said second combiner corresponding to the sine portion of said complex output signal.

* * * * *